US009723292B2

(12) United States Patent
Ono

(10) Patent No.: US 9,723,292 B2
(45) Date of Patent: Aug. 1, 2017

(54) IMAGING DEVICE

(71) Applicant: FUJIFILM Corporation, Tokyo (JP)

(72) Inventor: Shuji Ono, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/614,986

(22) Filed: Feb. 5, 2015

(65) Prior Publication Data
US 2015/0156478 A1 Jun. 4, 2015

Related U.S. Application Data

(63) Continuation of application No. PCT/JP2013/070725, filed on Jul. 31, 2013.

(30) Foreign Application Priority Data

Aug. 6, 2012 (JP) .................................. 2012-174288

(51) Int. Cl.
*H04N 13/02* (2006.01)
*G03B 13/36* (2006.01)
(Continued)

(52) U.S. Cl.
CPC ....... *H04N 13/0228* (2013.01); *G02B 3/0043* (2013.01); *G02B 3/10* (2013.01); *G02B 3/14* (2013.01); *G02B 5/06* (2013.01); *G02B 7/343* (2013.01); *G02B 7/38* (2013.01); *G02B 27/0075* (2013.01); *G03B 13/36* (2013.01); *H01L 27/14623* (2013.01); *H01L 27/14627* (2013.01); *H04N 5/2251* (2013.01);
(Continued)

(58) Field of Classification Search
CPC .............................. H04N 5/2251; G03B 13/36
USPC ............................................................ 348/49
See application file for complete search history.

(56) References Cited

U.S. PATENT DOCUMENTS 4,902,115 A * 2/1990 Takahashi .............. G02B 5/005
348/335
6,204,832 B1 * 3/2001 Melville ................ G09G 3/001
340/815.42
(Continued)

FOREIGN PATENT DOCUMENTS

CN  103139470   *  6/2013  ............. H04N 5/225
JP  2007-158825     6/2007
(Continued)

OTHER PUBLICATIONS

CN103139470 Description Translation.*
(Continued)

*Primary Examiner* — Nguyen Truong
(74) *Attorney, Agent, or Firm* — Young & Thompson

(57) ABSTRACT

An imaging device includes a multifocal main lens having different focal distances for a plurality of regions, an image sensor having a plurality of pixels configured of two-dimensionally arranged photoelectric converting elements, a multifocal lens array having a plurality of microlens groups at different focal distances disposed on an incident plane side of the image sensor, and an image obtaining device which obtains from the image sensor, a plurality of images for each of the focal distances obtained by combining the multifocal main lens and the plurality of microlens groups at different focal distances.

11 Claims, 17 Drawing Sheets

(51) Int. Cl.
*H04N 5/225* (2006.01)
*H01L 27/146* (2006.01)
*G02B 27/00* (2006.01)
*G02B 7/38* (2006.01)
*G02B 3/10* (2006.01)
*G02B 7/34* (2006.01)
*G02B 3/14* (2006.01)
*G02B 5/06* (2006.01)
*G02B 3/00* (2006.01)

(52) U.S. Cl.
CPC ....... *H04N 13/0282* (2013.01); *G02B 3/0006* (2013.01); *H04N 13/0232* (2013.01)

(56) References Cited

U.S. PATENT DOCUMENTS

| | | |
|---|---|---|
| 8,605,197 B2 | 12/2013 | Ono |
| 8,711,215 B2 | 4/2014 | Imamura |
| 2007/0252074 A1 | 11/2007 | Ng et al. |
| 2008/0266655 A1 | 10/2008 | Levoy et al. |
| 2012/0050562 A1 | 3/2012 | Perwass et al. |
| 2012/0081587 A1* | 4/2012 | Ryu .................. H01L 27/14627 348/302 |
| 2013/0120564 A1 | 5/2013 | Imamura |
| 2013/0222676 A1 | 8/2013 | Ono |
| 2014/0168622 A1* | 6/2014 | Mizumura ........... G02B 3/0056 355/53 |

FOREIGN PATENT DOCUMENTS

| | | |
|---|---|---|
| JP | 2008-515110 | 5/2008 |
| JP | 2009-162847 | 7/2009 |
| JP | WO 2010/121637 | 10/2010 |
| JP | 2012-088696 | 5/2012 |
| WO | WO 2012/017577 | 2/2012 |
| WO | WO 2012/043211 | 4/2012 |

OTHER PUBLICATIONS

International Search Report, PCT/JP2013/070725, Oct. 29, 2013.
Written Opinion, PCT/JP2013,070725, Oct. 29, 2013.
Supplementary European Search Report dated Jan. 25, 2016 in corresponding European Patent Application No. 13828303.
Chinese Office Action dated Mar. 25, 2016 in corresponding Chinese Patent Application No. 201380041427.X with English translation of Chinese Office Action.
European Official Communication dated Nov. 16, 2016; Application No. 13828303.1.

* cited by examiner

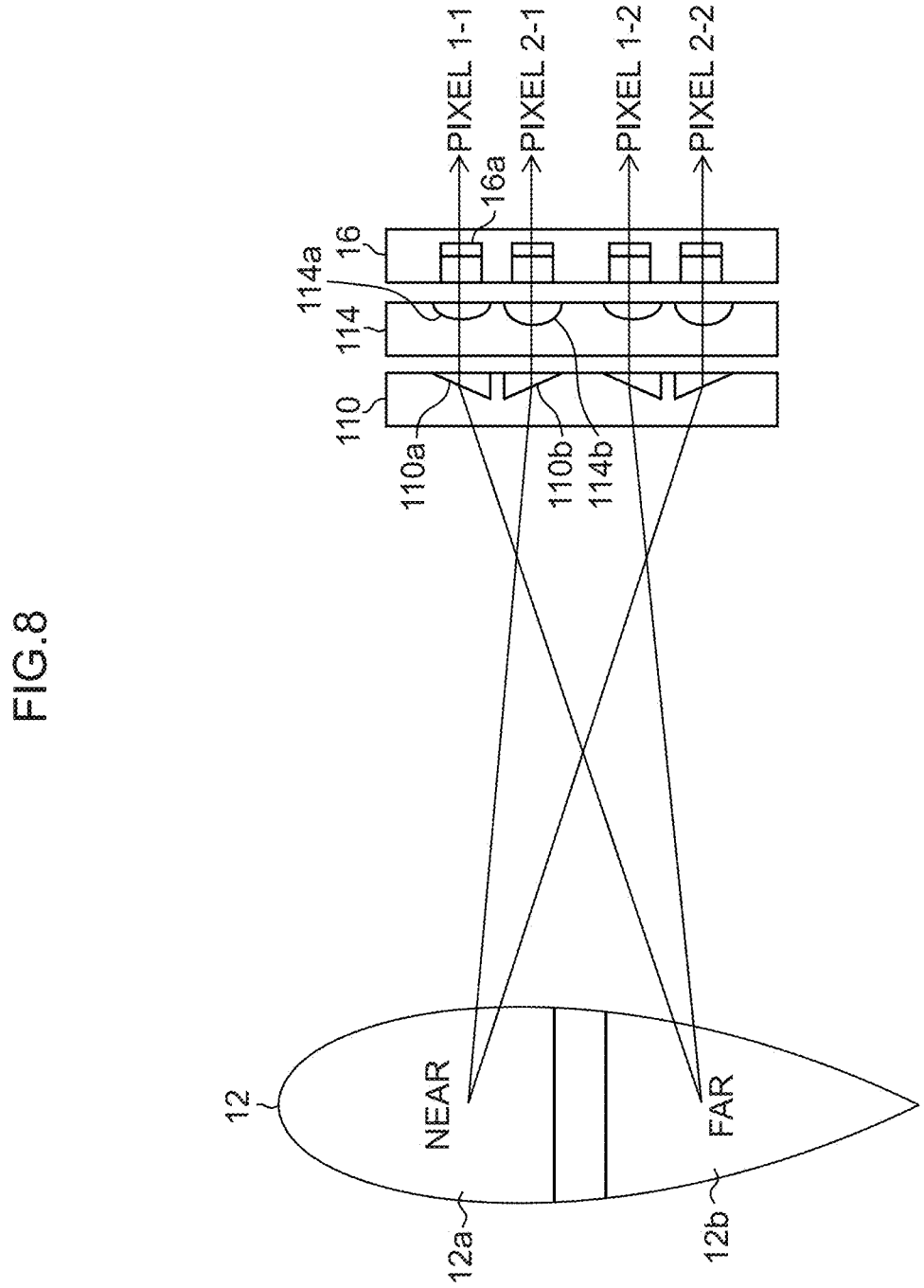

IMAGING DEVICE

CROSS-REFERENCE TO RELATED APPLICATIONS

This application is a Continuation of PCT International Application No. PCT/JP2013/070725 filed on Jul. 31, 2013, which claims priority under 35 U.S.C§119(a) to Japanese Patent Application No. 2012-174288 filed on Aug. 6, 2012. Each of the above application(s) is hereby expressly incorporated by reference, in its entirety, into the present application.

BACKGROUND OF THE INVENTION

Field of the Invention

The present invention relates to imaging devices and, in particular, relates to an imaging device capable of simultaneously obtaining a plurality of images with different focal subject distances.

Description of the Related Art

Conventionally, as a microlens array configuring a plenoptic camera, an image input device has been suggested, in which a microlens array configured of a plurality of lens sets at different focal distances is provided on a front surface side of an image pickup element and images are re-formed at the image pickup element for each of the plurality of lens sets, thereby allowing a plurality of images at different focal distances to be obtained from the image pickup element (PTL 1: Japanese Patent Application Laid-Open No. 2007-158825).

Also, an imaging device has been suggested by the inventor, in which a lens with a different characteristic (for example, focal length and frequency) for each region is used as a main lens, focal images formed by this main lens at a plurality of positions, and a plurality of images at different focal distances can be independently imaged by an image pickup element which selectively receiving an optical signal for each passage position in a pupil region (PTL 2: Japanese Patent Application Laid-Open No. 2012-88696).

SUMMARY OF THE INVENTION

While the image input device described in PTL 1 can obtain a plurality of images at different focal distances, the upper limit of the plurality of images at different focal distances depends on the number of (types of) the plurality of lens sets at different focal distances of the microlens array. However, if the number of types of lens sets is increased, difficulty in manufacturing the microlens array is increased, thereby causing an increase in manufacturing cost.

Also, while the imaging device described in PTL 2 can obtain a plurality of images at different focal distances by making the main lens multifocal, the upper limit of the plurality of images at different focal distances depends on the number of (types of) focal distances for each region of the main lens. However, if the number of focal points of the main lens is increased, difficulty in manufacturing the main lens is increased, thereby causing an increase in manufacturing cost.

The present invention was made in view of these circumstances, and has an object of providing an imaging device capable of dramatically increasing the number of taken images at different focal distances that are simultaneously obtainable, without increasing difficulty in manufacture, the imaging device that can be manufactured at low cost.

To achieve the object described above, an imaging device according to one aspect of the present invention includes a multifocal main lens having different focal distances for a plurality of regions, an image sensor having a plurality of pixels configured of two-dimensionally arranged photoelectric converting elements, a multifocal lens array having a plurality of microlens groups at different focal distances disposed on an incident plane side of the image sensor, and an image obtaining device which obtains from the image sensor, a plurality of images for each of the focal distances obtained by combining the multifocal main lens and the plurality of microlens groups at different focal distances.

According to the one aspect of the present invention, by combining the multifocal main lens and the multifocal microlens array, the number of taken images at different focal distances that are simultaneously obtainable can be dramatically increased. Also, for the plurality of images at different focal distances, the number of (types of) focal distances of the multifocal main lens and the number of (types of) focal distances of the multifocal microlens array can be decreased. With this, an increase in manufacturing cost of the multifocal main lens and the multifocal main lens array can be prevented.

In the imaging device according to another aspect of the present invention, in each of the pixels of the image sensors, an image is formed corresponding to any one in a range of the plurality of focal distances obtained by combining the multifocal main lens and the multifocal microlens array. Therefore, by rearranging output signals from the respective pixels of the image sensor for each focal distance, a plurality of images for each focal distance can be obtained.

In the imaging device according to still another aspect of the present invention, when the number of focal points of the multifocal main lens is taken as m and the number of focal points of the multifocal microlens array is taken as n, the image obtaining device obtains m×n images at different focal distances. With this, compared with the number of focal points, m, of the multifocal main lens and the number of focal points, n, of the multifocal microlens array, the number of taken images (m×n) at different focal distances that are simultaneously obtainable can be dramatically increased.

In the imaging device according to yet another aspect of the present invention, the plurality of focal distances of the multifocal main lens and a focal length of the multifocal microlens array are preferably determined so that the focal distances of the m×n images are spaced uniformly. With this, a plurality of images with uniform focal accuracy can be obtained irrespectively of the subject distance.

In the imaging device according to yet another aspect of the present invention, the plurality of focal distances of the multifocal main lens and a focal length of the multifocal microlens array are preferably determined so that the focal distances of the m×n images are spaced densely near one or two or more preset focal distances. With this, many focal planes can be arranged near an important depth position.

In the imaging device according to yet another aspect of the present invention, in the multifocal microlens array, each of the microlens groups at different focal distances preferably has an equal number of lenses. With this, the image sizes (resolutions) of the plurality of images at different focal distances can be made uniform.

In the imaging device according to yet another aspect of the present invention, in the multifocal microlens array, each of the microlens groups at different focal distances may have a different number of lenses.

In the imaging device according to yet another aspect of the present invention, in the multifocal microlens array, each microlens group of the plurality of microlens groups at different focal distances may have a different density according to a position in the multifocal microlens array.

In the imaging device according to yet another aspect of the present invention, the imaging device preferably includes a first focal distance changing device which changes at least one focal distance among the focal distances in the plurality of regions of the multifocal main lens. With this, many focal planes can be arranged near a desired depth position.

In the imaging device according to yet another aspect of the present invention, the imaging device preferably includes a second focal distance changing device which changes a focal distance of at least one microlens group among the focal distances of the plurality of microlens groups in the multifocal microlens array. With this, many focal planes can be arranged near a desired depth position.

According to the present invention, the multifocal main lens and the multifocal microlens array are combined, and a plurality of images for each focal distance obtained by combining the multifocal main lens and a plurality of microlens groups at different focal distances are each obtained. Therefore, the number of taken images at different focal distances that are simultaneously obtainable can be dramatically increased.

BRIEF DESCRIPTION OF THE DRAWINGS

FIG. 8 is a diagram depicting a second embodiment of the multifocal microlens array.

FIG. 14B is changed.

FIG. 14B is changed.

FIG. 14B is changed.

DETAILED DESCRIPTION OF THE EMBODIMENTS

Embodiments of the imaging device according to the present invention are described below according to the attached drawings.

<Outer Appearance of Imaging Device>

Figure 1:
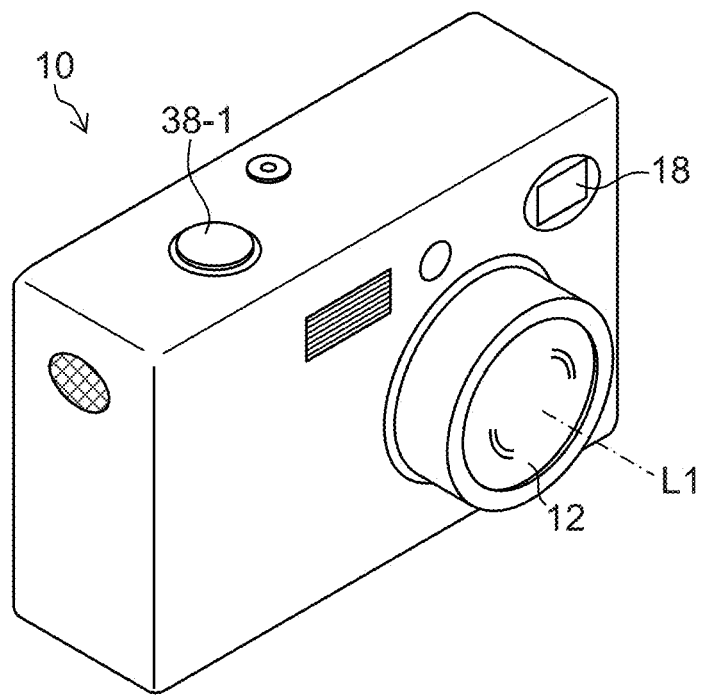
FIG. 1 is an external perspective view of an imaging device according to a first embodiment of the present invention.

FIG. 1 is an external perspective view of an imaging device 10 (imaging device) according to a first embodiment of the present invention. As depicted in FIG. 1, a taking lens (multifocal main lens) 12, a stroboscope 18, and others are arranged on a front surface of the imaging device 10, and a shutter button 38-1 is provided on an upper surface thereof. L1 denotes an optical axis of the multifocal main lens 12.

Figure 2:
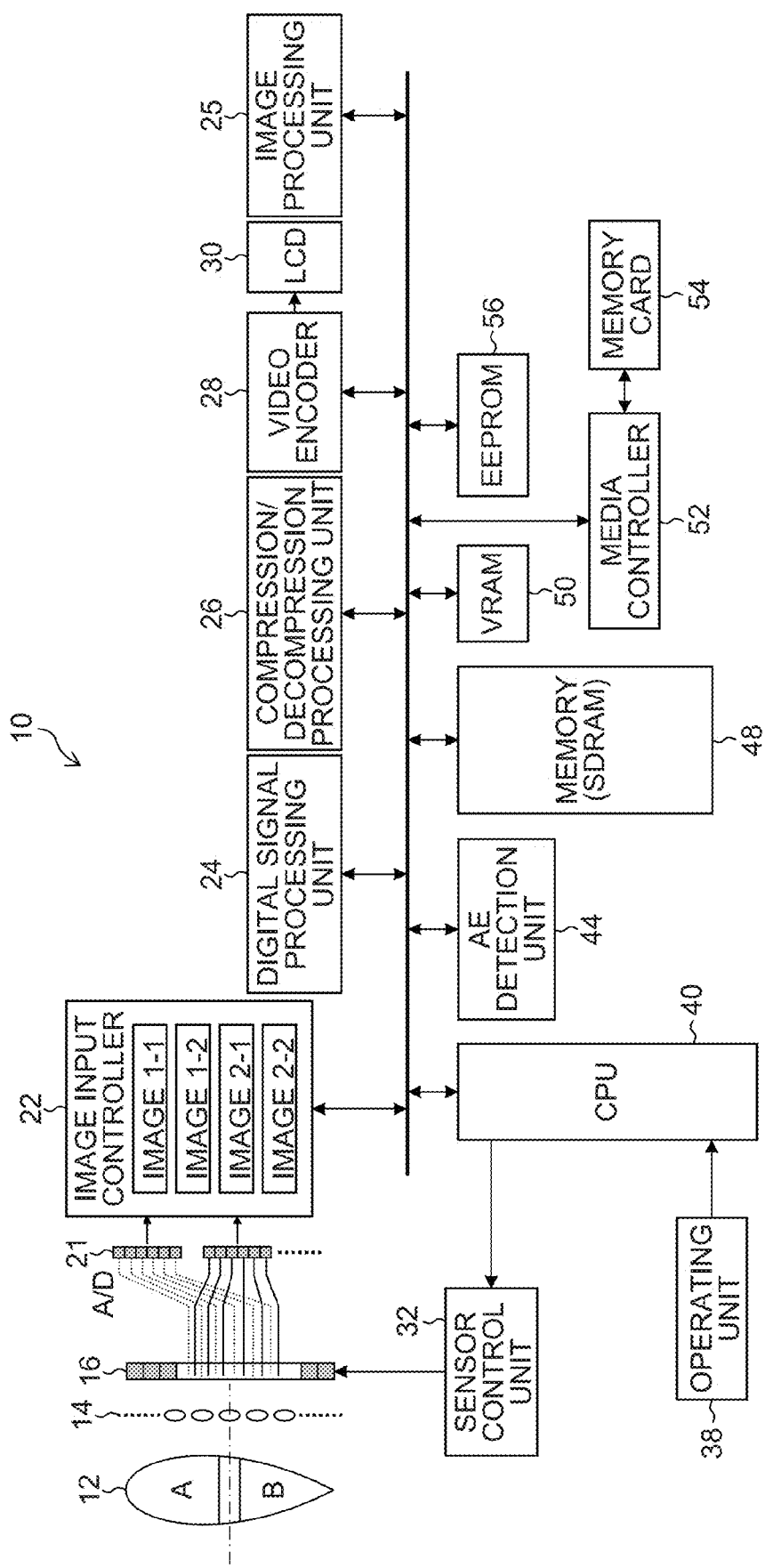
FIG. 2 is a block diagram depicting an embodiment of an inner structure of the imaging device depicted in FIG. 1.

FIG. 2 is a block diagram depicting an embodiment of an inner structure of the imaging device 10.

This imaging device 10 records a taken image in a memory card 54, and has an imaging optical system for a so-called plenoptic camera, with a multifocal microlens array 14 provided between the multifocal main lens 12 and a CMOS-type image pickup element (image sensor) 16. The operation of the device as a whole is controlled in a centralized manner by a central processing unit (CPU) 40.

The imaging device 10 is provided with an operating unit 38 including the shutter button 38-1, a mode dial, a replay button, a MENU/OK key, a cross key, a BACK key, etc. A signal from this operating unit 38 is inputted to the CPU 40, and the CPU 40 controls each circuit of the imaging device 10 based on the input signal, for example, performing imaging operation control, image processing control, image data recording/replay control, and display control over a liquid-crystal monitor (LCD) 30.

The shutter button 38-1 (FIG. 1) is an operation button for inputting an instruction for starting imaging, and is configured of a two-step stroke switch having an S1 switch which is turned ON when pressed halfway down and an S2 switch which is turned ON when pressed all the way down. The mode dial is a selecting device which selects any of auto imaging mode for taking still pictures, manual imaging mode, scene positions such as people, scenery, and nightscape, and moving picture mode for taking moving pictures.

The replay button is a button for switching to replay mode for displaying the taken and recorded still picture or moving picture on the liquid-crystal monitor 30. The MENU/OK key is an operation key with both of a function as a menu button for making an instruction for displaying a menu on the screen of the liquid-crystal monitor 30 and a function as an OK button for making an instruction for entering and preforming a selected content. The cross key is an operating unit for inputting instructions in four directions, that is, up, down, left, and right, and functions as a button (cursor movement operating device) for selecting an item from the menu screen and making an instruction for selecting any of various setting items from each menu. An up/down key of the cross key functions as a zoom switch at the time of imaging or a replay zoom switch in the replay mode, and a left/right key functions as a frame advance (forward direction/backward direction advance) button in the replay mode. The BACK key is used to delete a desired target such as a selected item, cancel an instruction, or return to an immediately previous operation state, for example.

In the imaging mode, an image of subject light is formed on a light-receiving plane of the CMOS-type image pickup element (image sensor) 16 via the multifocal main lens 12 and the multifocal microlens array 14.

Figure 3:
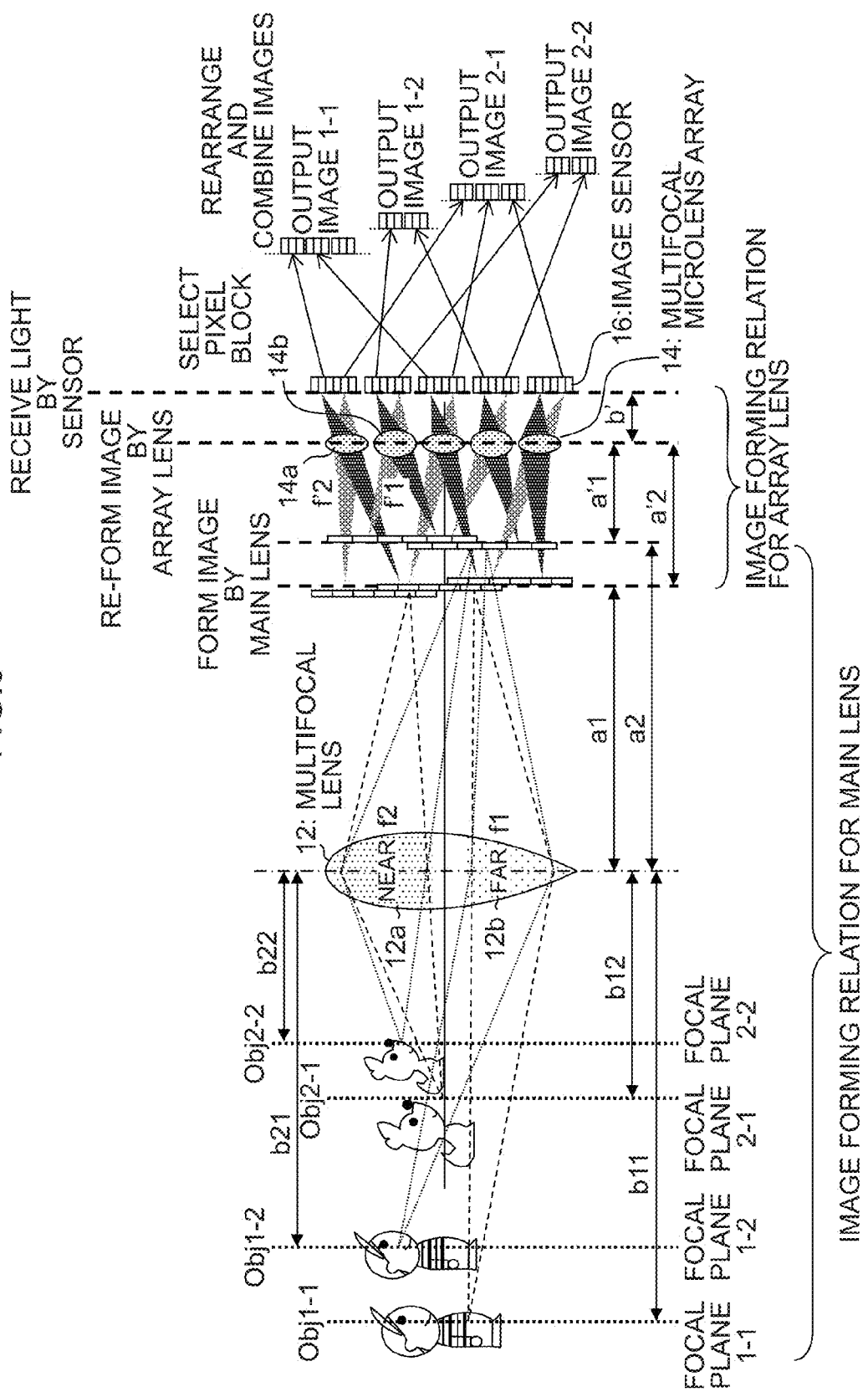
FIG. 3 is a diagram depicting image forming relations for a multifocal main lens and a multifocal microlens array.

The multifocal main lens 12 of the first embodiment is a multifocal (bifocal) main lens having a region 12a with a focal length f2 for near-distance imaging and a region 12b with a focal length f1 for far-distance imaging, as depicted in FIG. 3. The region 12a and the region 12b are an upper-half region and a lower-half region, respectively, with the optical axis as a boundary. Note that a light-shielding band is provided between the region 12a and the region 12b so that no crosstalk occurs between light beams.

Figure 4:
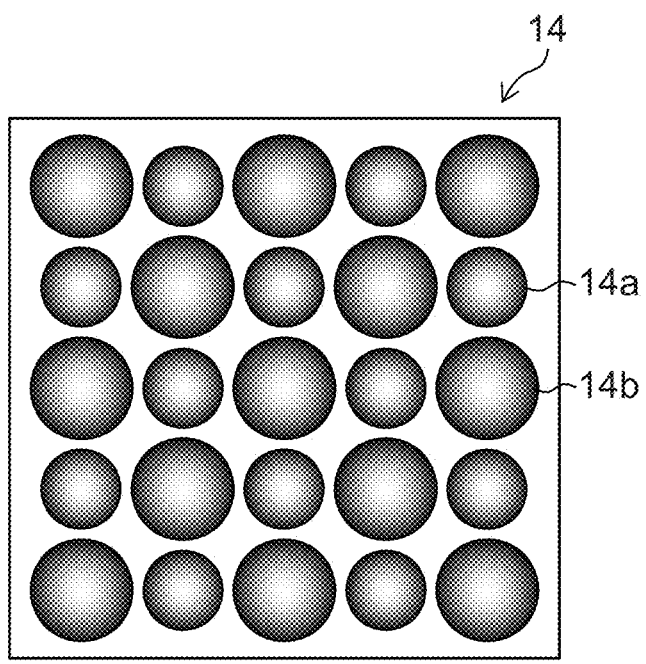
FIG. 4 is a graphical overview of part of the multifocal microlens array depicted in FIG. 1 viewed from front.

Also, the multifocal microlens array 14 of the first embodiment has a plurality of (two) microlens groups with different focal lengths (focal distances), as depicted in FIG. 3. FIG. 4 is a graphical overview of part of the multifocal microlens array 14 viewed from front.

The two microlens groups in the multifocal microlens array 14 are formed of a microlens group 14a with a focal length f'1 and a microlens group 14b with a focal length f'2. In the present embodiment, f'1<f'2.

Next, image forming relations for the multifocal main lens 12 and the multifocal microlens array 14 are described.

As depicted in FIG. 3, a distance from the multifocal main lens 12 to a subject Obj1-1 (focal plane 1-1) is taken as b11, a distance therefrom to a subject Obj1-2 (focal plane 1-2) is taken as b21, a distance therefrom to a subject Obj2-1 (focal plane 2-1) is taken as b12, a distance therefrom to a subject Obj2-2 (focal plane 2-2) is taken as b22, distances for the subjects Obj1-1 and Obj1-2 passing through the region 12b with a focal length f1 for far-distance imaging from the multifocal main lens 12 to each image forming position are taken as a1, and a2, respectively, and distances for the subjects Obj2-1 and Obj2-2 passing through the region 12a with a focal length f2 for far-distance imaging from the multifocal main lens 12 to each image forming position are taken as a1, and a2, respectively. A relation among these can be represented by the following formula based on lens formulas.

[Formula 1]
Focal length f1 of the main lens:

$$1/f1 = 1/a1 + 1/b11$$

$$1/f1 = 1/a2 + 1/b12$$

Focal length f2 of the main lens:

$$1/f2 = 1/a1 + 1/b21$$

$$1/f2 = 1/a2 + 1/b22$$

On the other hand, as depicted in FIG. 3, the microlens group 14a of the multifocal microlens array 14 has the focal length f'1 for forming an image positioned at a distance a'1 on a subject side from the multifocal microlens array 14 on the image sensor 16 having a light-receiving surface at a position at a distance b' from the multifocal microlens array 14, and the microlens group 14b has the focal length f'2 for forming an image positioned at a distance a'2 on a subject side from the multifocal microlens array 14 on the image sensor 16 having a light-receiving surface at a position at a distance b' from the multifocal microlens array 14. A relation among these can be can be represented by the following formula based on the lens formulas.

[Formula 2]
Focal length f1 of the microlens group 14a:

$$1/f'1 = 1/a'1 + 1/b'$$

Focal length f2 of the microlens group 14b:

$$1/f'2 = 1/a'2 + 1/b'$$

Also, the position of the distance a'1 on the subject side from the multifocal microlens array 14 corresponds to the position of the distance a2 on an image sensor 16 side from the multifocal main lens 12, and the position of the distance a'2 on the subject side from the multifocal microlens array 14 corresponds to the position of the distance a1 on an image sensor 16 side from the multifocal main lens 12.

Therefore, the image of the subject Obj1-1 (focal plane 1-1) passes through the region 12b with the focal length f1 for far-distance imaging of the multifocal main lens 12 and is formed at the position of the distance a1, and this formed image is re-formed at the image sensor 16 by the microlens group 14b with the focal length f'2. Similarly, the image of the subject Obj1-2 (focal plane 1-2) passes through the region 12b with the focal length f1 for far-distance imaging of the multifocal main lens 12 and is formed at the position of the distance a2, and this formed image is re-formed at the image sensor 16 by the microlens group 14a with the focal length f'1. The image of the subject Obj2-1 (focal plane 2-1) passes through the region 12a with the focal length f2 for near-distance imaging of the multifocal main lens 12 and is formed at the position of the distance a1, and this formed image is re-formed at the image sensor 16 by the microlens group 14b with the focal length f'2. The image of the subject Obj2-2 (focal plane 2-2) passes through the region 12a with the focal length f2 for near-distance imaging of the multifocal microlens array 14 and is formed at the position of the distance a2, and this formed image is re-formed at the image sensor 16 by the microlens group 14a with the focal length f'1.

Note that the multifocal microlens array 14 is integrally fixed to the image sensor at a position away from the light-receiving plane of the image sensor 16 by a distance b' toward the front.

Meanwhile, upper images among fine images for respective lenses formed at the image sensor 16 by the respective lenses of the microlens group 14a of the multifocal microlens array 14 are those obtained by receiving light beams passing through the region 12*b* (lower-half region) with the focal length f1 for far-distance imaging of the multifocal main lens 12, and lower images among the fine images for the respective lenses are those obtained by receiving light beams passing through the region 12*a* (upper-half region) with the focal length f2 for near-distance imaging of the multifocal main lens 12.

Similarly, upper images among fine images for respective lenses formed at the image sensor 16 by the respective lenses of the microlens group 14*b* of the multifocal microlens array 14 are those obtained by receiving light beams passing through the region 12*b* (lower-half region) with the focal length f1 for far-distance imaging of the multifocal main lens 12, and lower images among the fine images for the respective lenses are those obtained by receiving light beams passing through the region 12*a* (upper-half region) with the focal length f2 for near-distance imaging of the multifocal main lens 12.

Therefore, by rearranging the upper images among the fine images for the respective lenses formed at the image sensor 16 by the respective lenses of the microlens group 14*b* according the positions of the respective lenses of the microlens group 14*b*, an output image 1-1 focused on the subject Obj1-1 (focal plane 1-1) can be obtained. Similarly, by rearranging the upper images among the fine images for the respective lenses formed at the image sensor 16 by the respective lenses of the microlens group 14*a* according the positions of the respective lenses of the microlens group 14*a*, an output image 1-2 focused on the subject Obj1-2 (focal plane 1-2) can be obtained. By rearranging the lower images among the fine images for the respective lenses formed at the image sensor 16 by the respective lenses of the microlens group 14*b* according the positions of the respective lenses of the microlens group 14*b*, an output image 2-1 focused on the subject Obj2-1 (focal plane 2-1) can be obtained. By rearranging the lower images among the fine images for the respective lenses formed at the image sensor 16 by the respective lenses of the microlens group 14*a* according the positions of the respective lenses of the microlens group 14*a*, an output image 1-2 focused on the subject Obj2-2 (focal plane 2-2) can be obtained. That is, from a fine image group on a pupil surface formed on the image sensor 16 by the microlens group 14*a* or 14*b* of the multifocal microlens array 14, only a pixel at a specific position is extracted as an image for rearrangement, thereby allowing obtainment of an image receiving only an optical signal for each passage position on the lens pupil surface.

Referring back to FIG. 2, the image sensor 16 has many light-receiving cells (light-receiving elements) two-dimensionally arranged therein. A subject image formed on the light-receiving surface of each light-receiving cell is converted to a signal voltage (or electric charge) with an amount according to an incident light amount. Note that the image sensor 16 has red (R), green (G), and blue (B) color filters disposed for each light-receiving element.

The signal voltage (or electric charge) accumulated in the image sensor 16 is stored in the light-receiving element itself or a capacitor annexed thereto. The stored signal voltage (or electric charge) is read by a sensor control unit 32 by using a scheme of a MOS-type image pickup element (a so-called CMOS sensor) using an X-Y address scheme, together with selecting a pixel position.

With this, read can be made from the image sensor 16 for each pixel corresponding to each focal distance of the plurality of focal distances obtained by combining the multifocal main lens 12 and the multifocal microlens array 14.

For an imaging signal (voltage signal) read from the image sensor 16, R, G, and B signals for each pixel are subjected to sampling and hold processing by a correlated double sampling process (a process of, for the purpose of reducing noise (in particular, thermal noise) and the like included in an output signal from the image sensor, taking a difference between a field-thorough component level included in the output signal for each pixel of the image sensor and a pixel signal component level to obtain accurate pixel data), are amplified, and then are added to an A/D converter 21. The A/D converter 21 converts the sequentially-inputted R, G, and B signals into digital R, G, and B signals for output to an image input controller 22. Note that a MOS-type image sensor may have an A/D converter incorporated therein and, in this case, digital R, G, B signals are directly outputted from the image sensor 16.

When the number of focal points of the multifocal main lens 12 is taken as m and the number of focal points of the multifocal microlens array 14 is taken as n, m×n images at different focal distances can be obtained. In this example, the number of focal points of the multifocal main lens 12 is two, that is, the focal lengths f1 and f2, and the number of focal points of the multifocal microlens array 14 is two, that is, the focal lengths f'1 and f'2 of the two microlens groups 14*a* and 14*b*. Therefore, four (=2×2) images 1-1, 1-2, 2-1, and 2-1 can be obtained. The four pieces of image data at different focal distances can be obtained by selecting pixel positions from the image sensor 16 and reading pixel data. Alternatively, all pieces of pixel data may be read from the image sensor 16 and temporarily stored in a memory (SDRAM) 48, and then four pieces of image data at different focal distances may be extracted from the memory 48.

A digital signal processing unit 24 performs signal processing on digital image signals inputted via the image input controller 22, such as offset processing, gain control processing including white balance correction and sensitivity correction, gamma correction processing, and YC processing.

Also, while an image processing unit 25 performs the following processes, the processes to be performed by the image processing unit 25 are not indispensable.

While light beams passing through either one of the region 12*a* and the region 12*b* of the multifocal main lens 12 enter each light-receiving cell of the image sensor 16, crosstalk may occur between the light beams. The image processing unit 25 performs image processing for correcting image blurring and degradation in contrast due to the occurrence of crosstalk.

The image data processed by the image processing unit 25 is inputted to a VRAM 50. The image data read from the VRAM 50 is encoded at a video encoder 28, and outputted to the liquid-crystal monitor 30 provided to a back surface of the camera. With this, a subject image is displayed on a display screen of the liquid-crystal monitor 30.

When the shutter button 38-1 of the operating unit 28 is pressed at a first stage (halfway down), the CPU 40 (image obtaining device) starts an AE operation, and the image data outputted from the A/D converter 21 (image obtaining device) is captured into an AE detecting unit 44 (image obtaining device).

The AE detecting unit 44 integrates G signals on the entire screen or G signals weighted differently between a screen center part and a peripheral part, and outputs the obtained integrated value to the CPU 40. The CPU 40 calculates a brightness of the subject (imaging Ev value) from the integrated value inputted from the AE detecting unit 44, and determines an f-stop of an iris (not depicted) and an electronic shutter (shutter speed) of the image sensor 16 based on this imaging Ev value according to a program chart to control the iris based on the determined the f-stop and control a charge accumulation time at the image sensor 16 via the sensor control unit 32 (image obtaining device) based on the determined shutter speed.

When the AE operation ends and the shutter button 38-1 is pressed at the second stage (all the way down), image data outputted from the A/D converter 21 in response to this pressing is inputted from the image input controller 22 (image obtaining device) to the memory (SDRAM) 48 (image obtaining device) and is temporarily stored therein. The image data temporarily stored in the memory 48 is read by the digital signal processing unit (image obtaining device) and the image processing unit 25 (image obtaining device) as appropriate, wherein signal processing is performed including a process of generating luminance data and color difference data of the image data (YC processing). The image data subjected to YC processing (YC data) is again stored in the memory 48.

The YC data stored in the memory 48 is outputted to a compression/decompression processing unit 26 (image obtaining device), is subjected to compression processing of JPEG (joint photographic experts group) or the like, and is then recorded in a memory card 54 (image obtaining device) via a media controller 52 (image obtaining device). With this, four images at different focal distances can be simultaneously taken and recorded.

[Combination of Focal Lengths of Multifocal Main Lens and Multifocal Microlens Array]

Next, an embodiment of a combination of focal lengths of the multifocal main lens 12 and the multifocal microlens array 14 is described.

Figure 5:
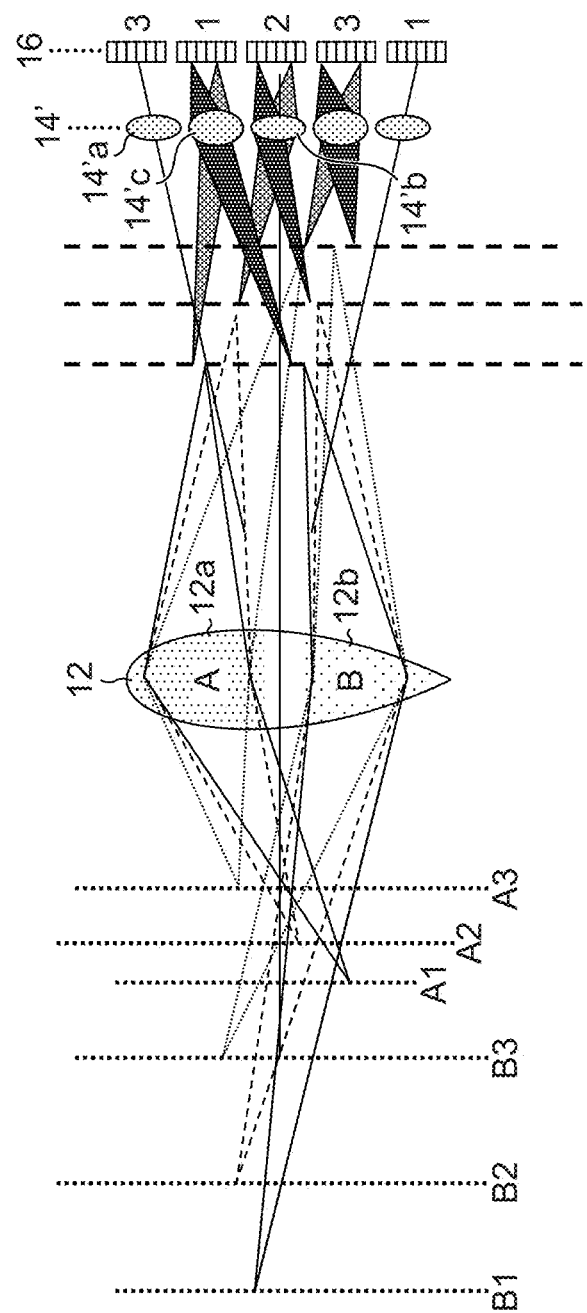
FIG. 5 is a diagram for use in describing a combination of focal lengths of the multifocal main lens and the multifocal microlens array.

As depicted in FIG. 5, the multifocal main lens 12 is a bifocal main lens having the region 12*a* with the focal length f2 for near-distance imaging and the region 12*b* with the focal length f1 for far-distance imaging. Also, a multifocal microlens array 14' has a plurality of (three) microlens groups 14'*a*, 14'*b*, and 14'*c* with different focal lengths (focal distances).

As described above, by combining the multifocal main lens 12 with two focal points and the multifocal microlens array 14' with three focal points, six images focused on focal planes A1, A2, A3, B1, B2, and B3 can be simultaneously taken.

Figure 6A:
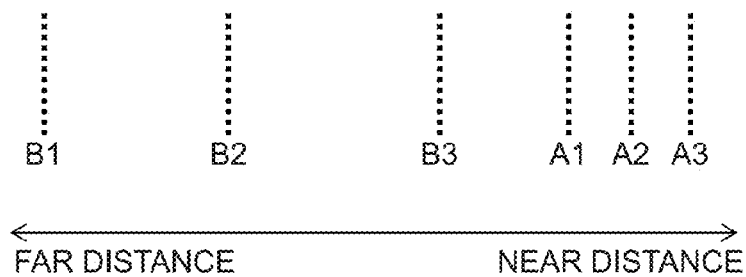
FIG. 6A is a diagram depicting a favorable example as six focal planes A1, A2, A3, B1, B2, and B3.

As depicted in FIG. 6A, the six focal planes A1, A2, A3, B1, B2, and B3 are preferably distributed over a range from a near distance to a far distance.

Figure 6B:
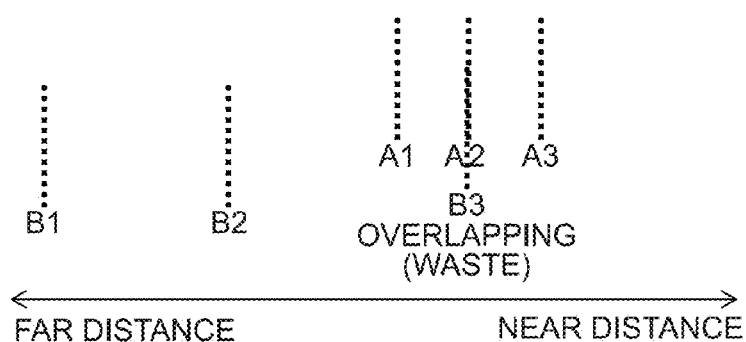
FIG. 6B is a diagram depicting an unfavorable example as six focal planes A1, A2, A3, B1, B2, and B3.

On the other hand, in an example depicted in FIG. 6B, the focal plane A2 and the focal plane B4 overlap each other among the six focal planes A1, A2, A3, B1, B2, and B3, and a wasteful image is taken.

Therefore, it is required to determine a plurality of focal lengths of the multifocal main lens and focal lengths of the plurality of microlens groups of the multifocal microlens array so that focal plane overlapping as depicted in FIG. 6B is prevented.

Figure 7A:
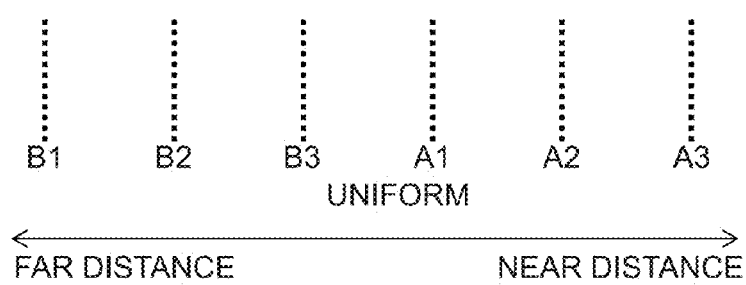
FIG. 7A is a diagram depicting a variation of settings of the focal planes.
Figure 7B:
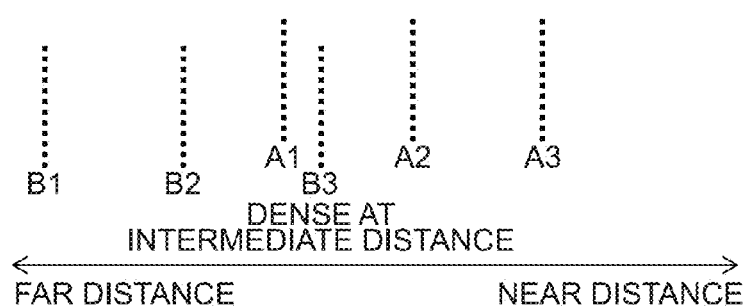
FIG. 7B is a diagram depicting another variation of settings of the focal planes.
Figure 7C:
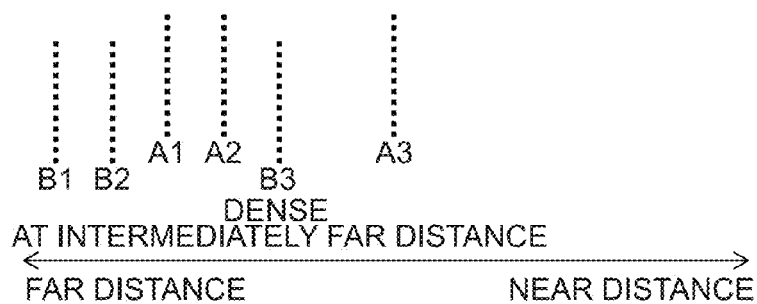
FIG. 7C is a diagram depicting still another variation of settings of the focal planes.

FIGS. 7A to 7C are diagrams depicting variations of settings of the focal planes.

FIG. 7A depicts an example in which the six focal planes A1, A2, A3, B1, B2, and B3 are uniformly distributed over a range from the near distance to the far distance. By setting the six focal planes A1, A2, A3, B1, B2, and B3 in this manner, an image focused on a main subject can be obtained even if the main subject is at any distance.

FIG. 7B depicts an example in which the six focal planes A1, A2, A3, B1, B2, and B3 are distributed so as to be dense at an intermediate distance. FIG. 7C depicts an example in which the six focal planes A1, A2, A3, B1, B2, and B3 are distributed so as to be dense at an intermediately far distance.

In the example depicted in FIG. 7B or FIG. 7C, when a subject viewed as important is present at the intermediate distance or intermediately far distance, an image with high focus accuracy with respect to the subject can be obtained.

[Second Embodiment of Multifocal Microlens Array]

FIG. 8 is a diagram depicting a second embodiment of the multifocal microlens array.

A multifocal microlens array 114 has two microlens groups 114*a* and 114*b* with different focal lengths, and each lens is formed so as to have a one-to-one correspondence with each light-receiving cell 16*a* of the image sensor 16.

Since each lens of the multifocal microlens array 114 has a one-to-one correspondence with each light-receiving cell 16*a* of the image sensor 16, a microprism array 110 is provided as a control device for restricting the direction of light beams incident to each light-receiving cell 16*a*.

That is, the microprism array 110 is provided on a front surface (a multifocal main lens 12 side) of the multifocal microlens array 114. The microprism array 110 has two types of prism groups 110*a* and 110*b* which refract incident light beams in different refracting directions. With this microprism array 110, the position of an exit pupil incident to the lens (that is, the light-receiving cell 16*a* of the image sensor 16) of the microlens group is controlled, and the light beams passing through the region 12*b* with the focal length f1 for far-distance imaging of the multifocal main lens 12 enter the microlens group 114*a* and the light beams passing through the region 12*a* with the focal length f2 for near-distance imaging of the multifocal main lens 12 enter the microlens group 114*b*.

With the above-described structure, a subject image at a different focal distance is formed for each light-receiving cell at the light-receiving cell 16*a* of the image sensor 16. With this, by rearranging outputs from the pixels 1-1, 1-2, 2-1, and 2-2 of the image sensor 16, four images at different focal distances can be obtained.

[Second Embodiment of Multifocal Main Lens]

Figure 9A:
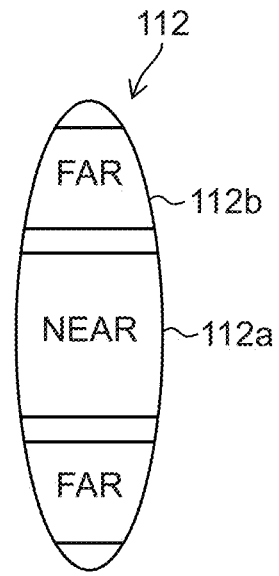
FIG. 9A is a side view of a multifocal main lens of the second embodiment.
Figure 9B:
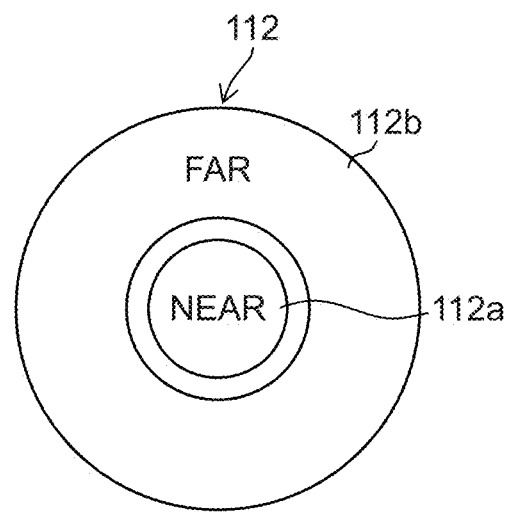
FIG. 9B is a front view of the multifocal main lens of the second embodiment.

FIG. 9A and FIG. 9B are a side view and a front view, respectively, of a multifocal main lens 112 of the second embodiment. The multifocal main lens 112 depicted in FIGS. 9A and 9B is a bifocal main lens having a region 112*a* with a focal length for near-distance imaging and a region 112*b* with a focal length for far-distance imaging. The region 112*a* is formed in a circular shape centering on the optical axis, and the region 112*b* is formed in an annular shape. Also, a light-shielding band is provided between the region 112*a* and the region 112*b* so that no crosstalk occurs between pupil-divided light beams.

As such, the multifocal main lens according to the present invention is not restricted to the one in which, as in the first embodiment, a plurality of regions with different focal lengths are dividedly formed in a vertical direction (or a horizontal direction) of the lens, and the plurality of regions may be dividedly formed into concentric circles.

[Another Embodiment of Pupil Dividing Device]

Figure 10:
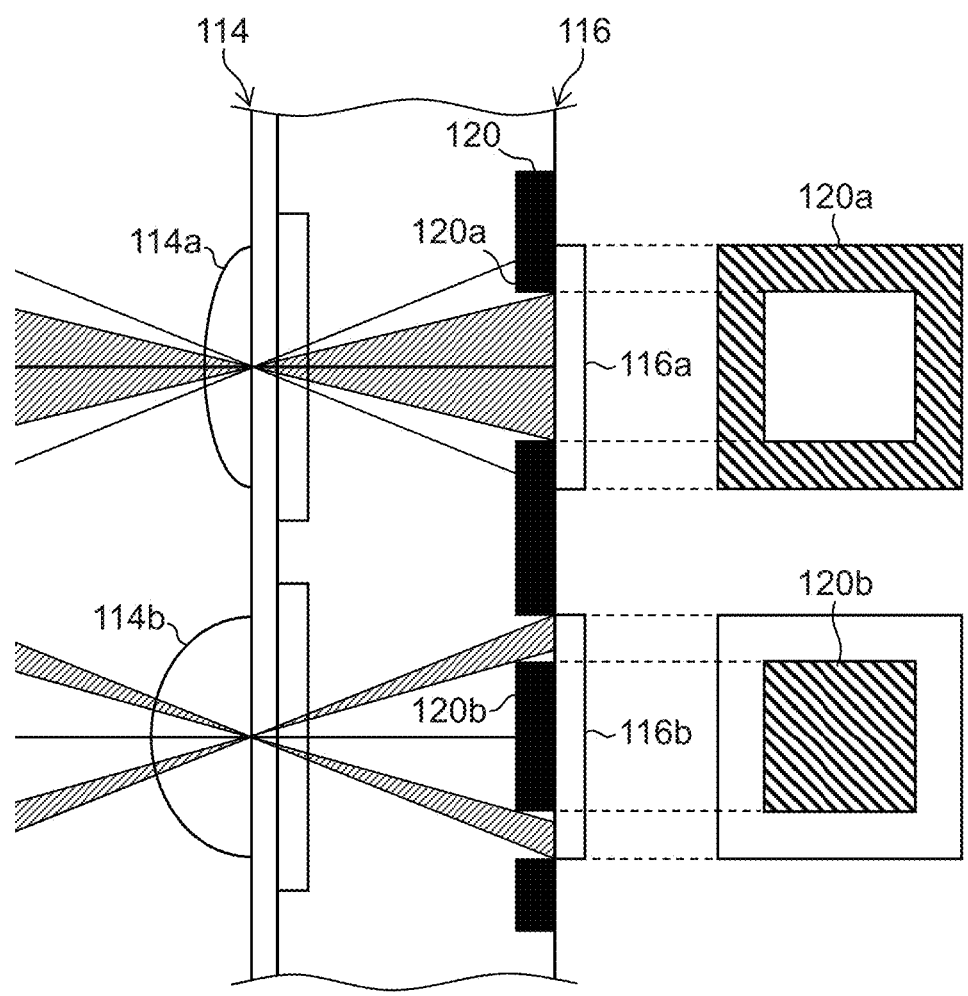
FIG. 10 is a side view depicting another embodiment of an optical element (pupil dividing device) for providing pupil directivity.

FIG. 10 is a side view depicting another embodiment of an optical element (pupil dividing device) for providing pupil directivity. The pupil dividing device is configured of the multifocal microlens array 114 and a light-shielding member 120.

The multifocal microlens array 114 depicted in FIG. 10 has two microlens groups 114a and 114b with different focal lengths, and each lens is formed so as to have a one-to-one correspondence with each light-receiving cell 116a of an image sensor 116.

The light-shielding member 120 regulates openings of the light-receiving cells 16a and 16b of the image sensor 16, and has an opening shape corresponding to the multifocal main lens 112 depicted in FIGS. 9A and 9B. Note that red (R), green (G), and blue (B) color filters are disposed below each lens of the multifocal microlens array 114.

A peripheral part of the opening of the light-receiving cell 16a is light-shielded by the light-shielding member 120. On the other hand, a center part of the opening of the light-receiving cell 116b is light-shielded by the light-shielding member 120. With this, light beams passing through the region 112a at the center part of the multifocal main lens 112 (FIGS. 9A and 9B) are subjected to pupil division by the multifocal microlens array 114 and a light-shielding unit 120a of the light-shielding member 120 and then enter the light-receiving cell 116a. On the other hand, light beams passing through the region 112b at the peripheral part of the multifocal main lens 112 are subjected to pupil division by the multifocal microlens array 114 and a light-shielding unit 120b of the light-shielding member 120 and then enter the light-receiving cell 116b.

Note that the multifocal main lens 112 has two regions 112a and 112b with different focal lengths, and the multifocal microlens array 114 has two microlens groups 114a and 114b with different focal lengths. Therefore, four images at different focal distances can be obtained from the image sensor 116.

[Third Embodiment of Multifocal Microlens Array]

Figure 11:
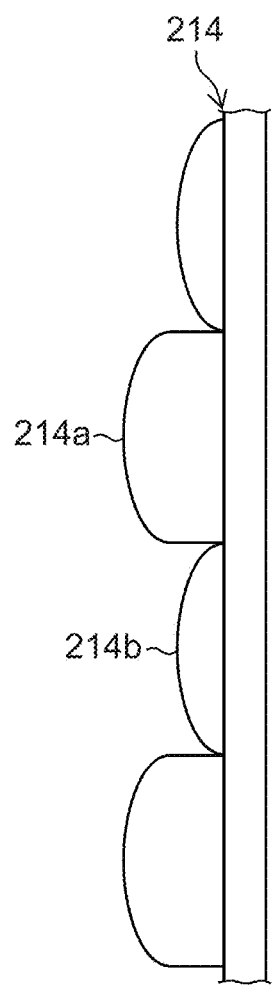
FIG. 11 is a side view depicting a third embodiment of the multifocal microlens array.

FIG. 11 is a side view depicting a third embodiment of the multifocal microlens array. A multifocal microlens array 214 depicted in FIG. 11 has two microlens groups, that is, a microlens group 214a and a microlens group 214b with different lens positions (heights) in an optical axis direction. With this, the microlens group 214a and the microlens group 214b have different focal distances.

[Number of Lenses of Microlens Group of Multifocal Microlens Array]

Figure 12:
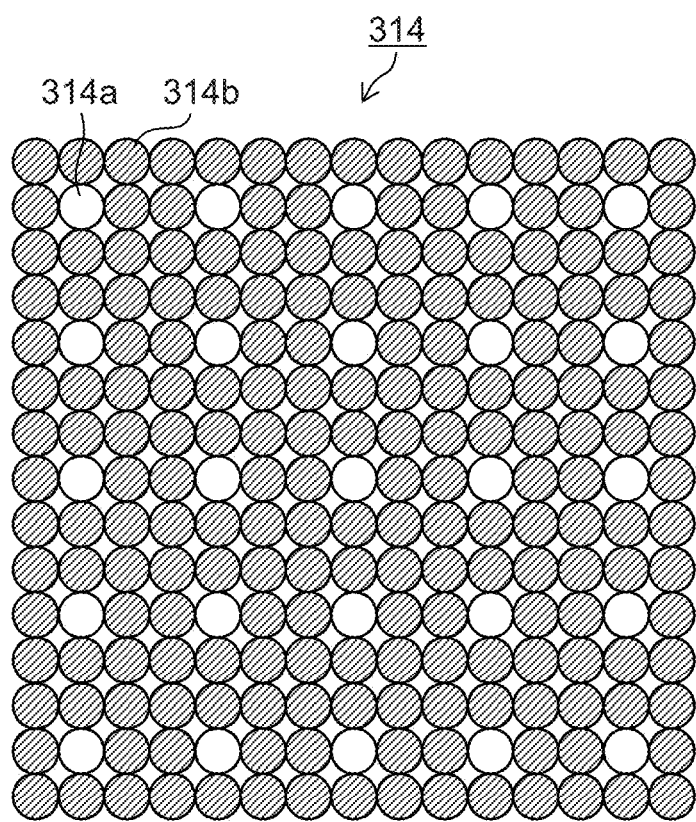
FIG. 12 is a graphical overview of an embodiment of weighting arrangement of the number of lenses of two microlens groups with different focal lengths of the multifocal microlens array.

FIG. 12 is a graphical overview of an embodiment of weighting the number of lenses of two microlens groups with different focal lengths of the multifocal microlens array.

A multifocal microlens array 314 depicted in FIG. 12 has a microlens group 314a and a microlens group 314b with different focal lengths. The microlens group 314a and the microlens group 314b each have a different number of lenses. For one lens of the microlens group 314b, eight surrounding lenses are of the microlens group 314a.

That is, a ratio between the number of lenses of the microlens group 314a and the number of lenses of the microlens group 314b is 1:8, and these lenses are arranged throughout an entire region.

Here, it is preferable that the microlens group 314a has a short focal length and the microlens group 314b has a long focal length. The reason why the number of lenses of the microlens group 314a with a short focal length is set smaller than the number of lenses of the microlens group 314b with a long focal length is that a subject at a focal distance corresponding to the microlens group 314b with a long focal length has a higher frequency of being imaged and its image is taken as more important. Also, in a camera-equipped portable telephone having this imaging device 10 mounted thereon, a barcode (one-dimensional barcode or two-dimensional barcode (QR code (registered trademark)) reading scene is mainly assumed as a near-distance imaging scene. In this case, the resolution is any as long as the resolution is ensured to allow barcode reading, and high image quality is not required.

[Arrangement Density of Microlens Groups of Multifocal Microlens Array]

Figure 13A:
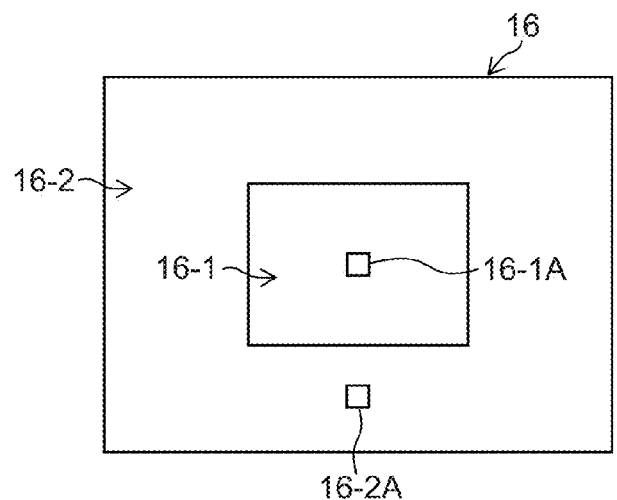
FIG. 13A is a graphical overview depicting an embodiment of weighting arrangement of the number of lenses of two microlens groups with different focal lengths of the multifocal microlens array.
Figure 13B:
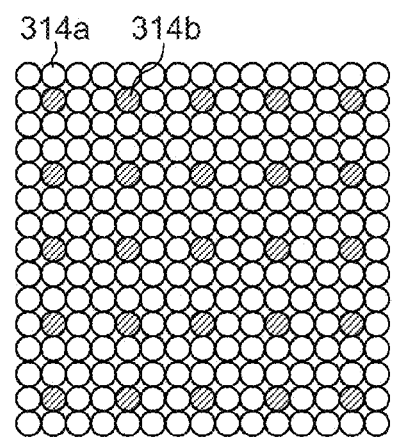
FIG. 13B is an enlarged view of a region 16-1A positioned at a center part 16-1 of an image sensor 16.
Figure 13C:
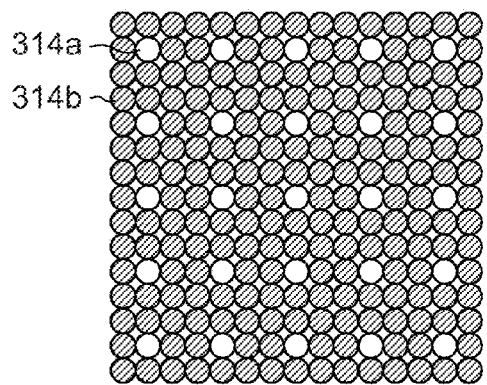
FIG. 13C is an enlarged view of a region 16-2A positioned at a peripheral part 16-2 of the image sensor 16.

FIG. 13A to FIG. 13C are graphical overviews depicting an embodiment of weighting arrangement density of two microlens groups with different focal lengths in the multifocal microlens array.

As depicted in FIG. 13A, the image sensor 16 is divided into two regions, that is, a center part 16-1 and a peripheral part 16-2. In the center part 16-1, the lenses are arranged so that the density of the microlens group 314a with a short focal length is higher than the density of the microlens group 314b with a long focal length, as depicted in FIG. 13B (an enlarged view of a region 16-1A). On the other hand, in the peripheral part 16-2, the lenses are arranged so that the density of the microlens group 314a with a short focal length is lower than the density of the microlens group 314b with a long focal length, as depicted in FIG. 13C (an enlarged view of a region 16-2A).

That is, allocation is made so that the arrangement density of the microlens group corresponding to an important focal distance is high. Specifically, different arrangement densities of the microlens group 314a and the microlens group 314b are set between the center part (near the optical axis) 16-1 and the peripheral part 16-2 of the image sensor 16. The density of the microlens group 314a with a short focal length is set high in the center part 16-1, and the density of the microlens group 314b with a long focal length is set high in the peripheral part 16-2.

Here, the reason why the arrangement density of the microlens group 314a in the center part 16-1 of the image sensor 16 is set high is that, in general close-up imaging, a main subject is often imaged as being positioned in the center part of the imaging screen and it is preferable to increase the image quality (resolution) of this center part.

Also, only the lenses of the microlens group 314a may be highly densely allocated in the center part 16-1 of the image sensor 16, and only the lenses of the microlens group 314b may be allocated in the peripheral part 16-2. For example, when barcode reading is performed in a camera-equipped portable telephone having the imaging device 10 mounted thereon, a display frame may be displayed for assistance so that a barcode is displayed on the liquid-crystal monitor so as to promote barcode imaging at an appropriate imaging distance. In this case, the microlens group 314a with a short focal length may be arranged only in a range where the barcode is imaged.

[Third Embodiment of Multifocal Main Lens]

Figure 14A:
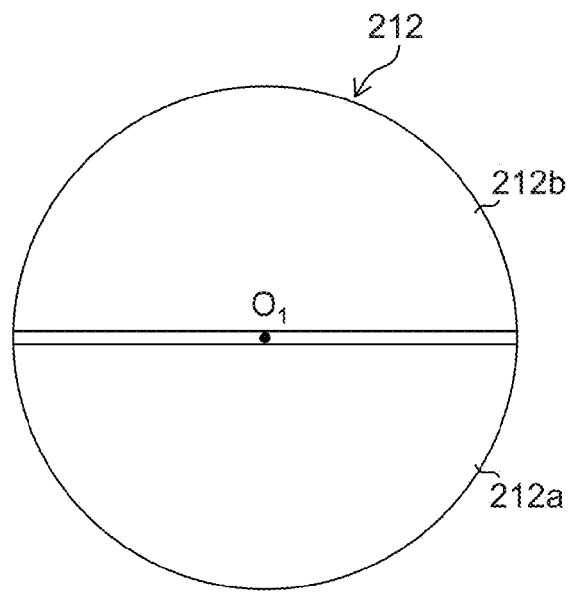
FIG. 14A is a front view depicting a third embodiment of the multifocal main lens.
Figure 14B:
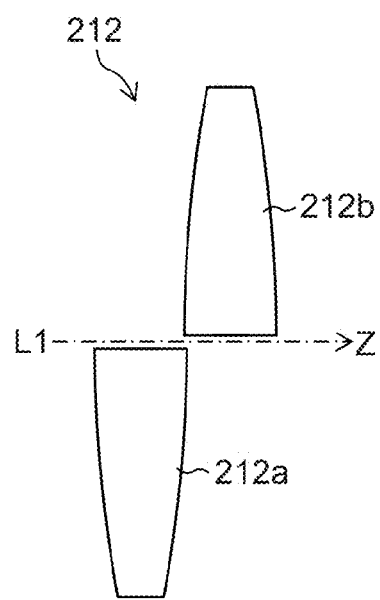
FIG. 14B is a side view depicting the third embodiment of the multifocal main lens.

In a multifocal main lens 212 depicted in FIGS. 14A and 14B, one lens is configured of semicircular-shaped lens units 212a and 212b obtained by vertically dividing the lens with respect to a lens center $O_1$, and the lens units 212a and 212b are arranged as being relatively shifted in an optical axis direction. Note that while the lens units 212a and the 212b of this embodiment have the same focal length, these lens units may have different focal lengths.

As depicted in FIG. 14B, the lens unit 212a is positioned more forward (on a subject side) than the lens unit 212b, the lens unit 212a has a focal distance for short-distance imaging, and the lens unit 212b has a focal distance for long distance.

Figure 15A:
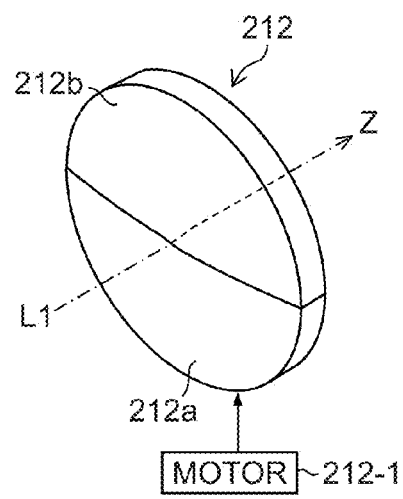
FIG. 15A is a diagram depicting the state in which the focal distance of the multifocal main lens depicted in FIG. 14A
Figure 15B:
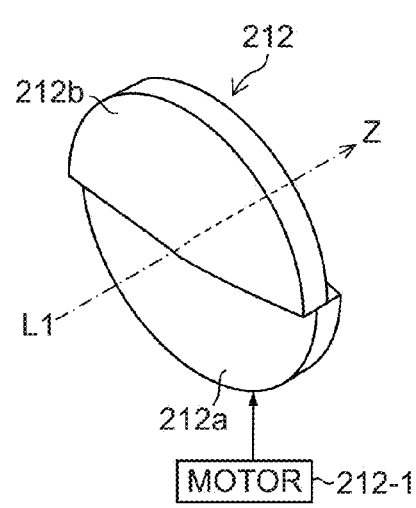
FIG. 15B is another diagram depicting the state in which the focal distance of the multifocal main lens depicted in FIG. 14A
Figure 15C:
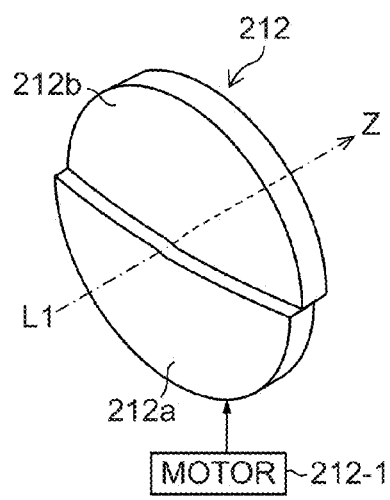
FIG. 15C is still another diagram depicting the state in which the focal distance of the multifocal main lens depicted in FIG. 14A

Also, as depicted in FIGS. 15A to 15C, the multifocal main lens 212 is configured so that the lens units 212*a* and 212*b* can be individually moved in the optical axis direction by a motor 212-1 (first focal distance changing device) driven by an instruction from the CPU 40. By individually moving the lens units 212*a* and 212*b* in the optical axis direction, the focal distances of the lens units 212*a* and 212*b* can be changed. As the motor 212-1, for example, a pulse-driven motor such as a stepping motor or a servo motor can be used.

FIG. 15A depicts the state in which the lens unit 212*a* and the lens unit 212*b* are at the same position in the optical axis direction. In this case, the multifocal main lens 212 functions as a normal lens with one focal distance. FIG. 15B depicts the state in which the lens unit 212*b* is positioned more forward than the lens unit 212*a*, and FIG. 15C depicts the state in which the lens unit 212*a* is positioned more forward than the lens unit 212*b*.

Note that either only one of the two lens units 212*a* and 212*b* may be fixed and only the other may be movable. Also, the two lens units 212*a* and 212*b* may be fixed (bonded) to each other to be integrated as being relatively shifted in the optical axis direction, and the two lens units 212*a* and 212*b* may be simultaneously moved in the optical axis direction to adjust the focal distances.

[Fourth Embodiment of Multifocal Microlens Array]

Figure 16:
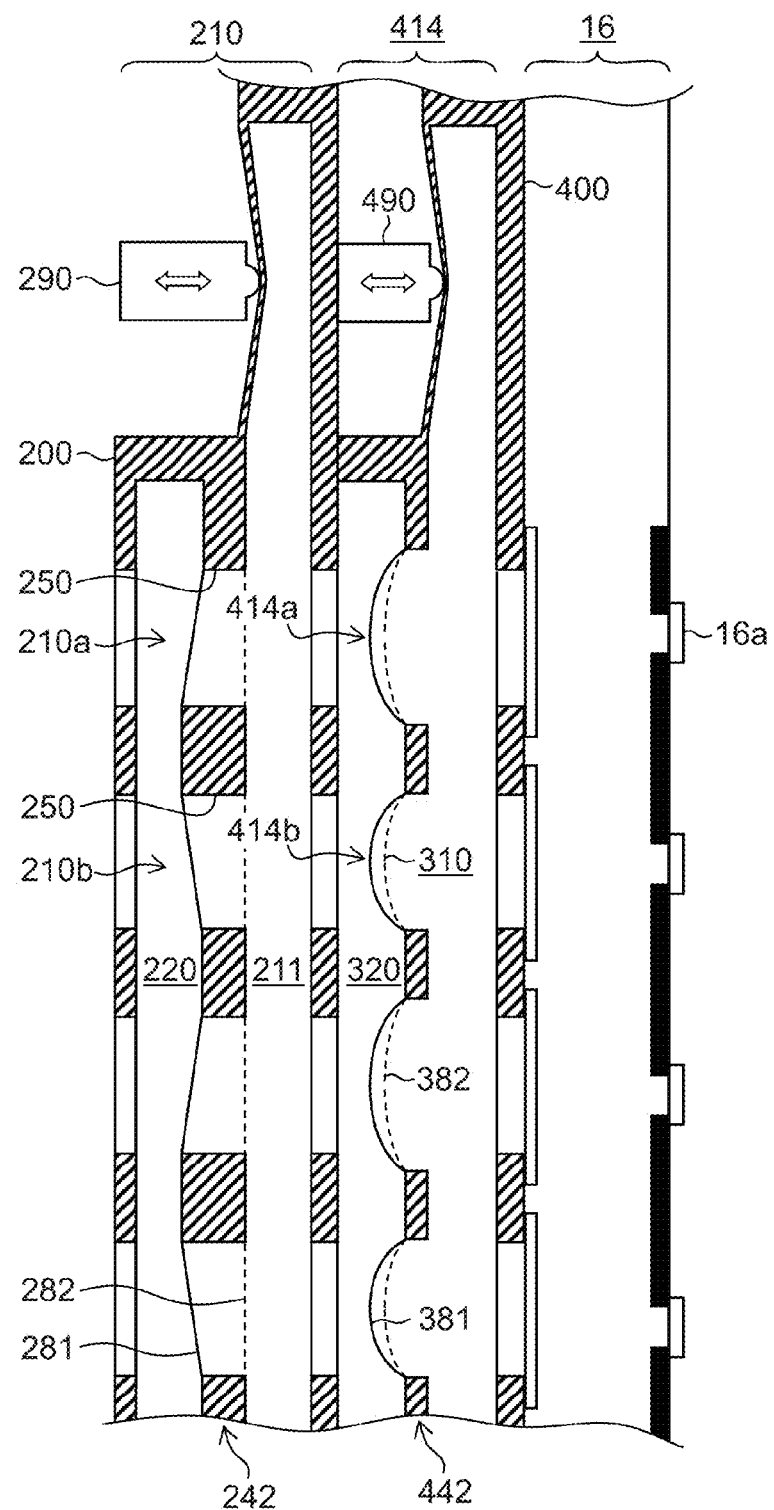
FIG. 16 is a diagram schematically depicting an example of structure of a microprism array and a multifocal microlens array of a fourth embodiment.

FIG. 16 is a diagram schematically depicting an example of structure of a microprism array 210 and a multifocal microlens array 414.

The microprism array 210 has two types of liquid prism groups 210*a* and 210*b* with different refracting directions formed at liquid interfaces with different refractive indexes. The refracting angle of each of the liquid prism groups 210*a* and 210*b* is defined by the angle of the interface.

The microprism array 210 has a housing 200 for retaining a first liquid and a second liquid, a partition plate 242, and a driving unit 290 (second focal distance changing device). The partition plate 242 divides the inside of the housing 200 into a first liquid region 211 to be filled with the first liquid and a second liquid region 220 to be filled with the second liquid. The first liquid and the second liquid have different refractive indexes, and properties of not mixing each other in a contact state, such as water and oil. An example of a combination of the first liquid and the second liquid can be PDMS (Poly-Dimethyl-Siloxane) and pure water. Here, it is assumed that the refractive index of the first liquid is larger than the refractive index of the second liquid. Also, it is preferable that the densities of the first liquid and the second liquid are substantially equal to each other.

In the partition plate 242, a plurality of through holes 250 are formed so as to correspond to positions where the liquid prism groups 210*a* and 210*b* are formed. The liquid prism groups 210*a* and 210*b* are respectively formed at positions where the through holes 250 are formed.

On each of surfaces of the housing 200 on an object side and an image side, a translucent unit formed of a translucent material such as glass is formed. The translucent unit is formed so as to correspond to the position where the liquid prism groups 210*a* and 210*b* are formed. Subject light passes through the translucent unit formed on the surface on the object side, the through hole 250, and the translucent unit formed on the image side to enter each corresponding lens of the multifocal microlens array 414.

The first liquid and the second liquid make contact with each other in the through holes 250 to form an interface serving as a liquid prism.

The through hole 250 has side surface parts with different thicknesses. When the pressure of the first liquid with which the first liquid region 211 is filled is set at a specific pressure, a flat interface is formed according to the pressure so that a liquid pressure difference and a surface tension are balanced. When the pressure of the first liquid is set at a first pressure so that the balance is achieved with each through hole 250 filled with the second liquid, an interface indicated by a broken line 282 is formed.

The partition plate 242 has a flat end face on a first liquid side, and the end face is parallel to the image side of the housing 200, and therefore the interface indicated by the broken line 282 does not substantially have a prism effect.

On the other hand, when the pressure of the first liquid is increased more than the first pressure to a second pressure so that the balance is achieved with each through hole 250 filled with the first liquid, the position of the interface is moved to a second liquid side to form an interface indicated by a solid line 281. This interface has an inclination according to the thickness of the side surface part forming each through hole 250. With this, two types of the liquid prism groups 210*a* and 210*b* with different refracting angles are formed.

Then, by driving the driving unit 290 in an arrow direction to control the internal pressure of the liquid region 211 retaining the first liquid, the inclination of the interface with respect to the optical axis can be controlled.

When the microprism array 210 is driven so as to form the liquid prism groups 210*a* and 210*b*, as with the microprism array 110 depicted in FIG. 8, the two types of the liquid prism groups 210*a* and 210*b* with different refracting directions control the position of the exit pupil incident to the lens of the microlens group (that is, the light-receiving cell 16*a* of the image sensor 16).

Next, the structure of a multifocal microlens array 414 of a fourth embodiment is described. Microlens groups 414*a* and 414*b* configuring the multifocal microlens array 414 are two types of liquid microlens groups with different focal lengths formed at interfaces of liquids with different refractive indexes. The refracting power of a liquid microlens group is defined by the opening size of the interface.

The multifocal microlens array 414 has a housing 400 for retaining a first liquid and a second liquid, a partition plate 442, and a driving unit 490 (second focal distance changing device). The partition plate 442 divides the inside of the housing 400 into a first liquid region 310 to be filled with the first liquid and a second liquid region 320 to be filled with the second liquid.

As with the housing 200, on each of surfaces of the housing 400 on an object side and an image side, a translucent unit formed of a translucent material such as glass is formed. Also, as with the partition plate 242, a plurality of through holes are formed in the partition plate 442 so as to correspond to positions where the plurality of light-receiving cells 16*a* are formed. Each lens of the multifocal microlens array 414 is formed by an interface between the first liquid and the second liquid at each of the plurality of through holes.

The first liquid and the second liquid make contact with each other on a liquid region 320 side of the partition plate 442 to form an interface serving as a microlens. Unlike the partition plate 242, the partition plate 442 may have the same thickness in the optical axis direction. The partition plate 442 has a surface parallel to a plane vertical to the optical axis at least on a liquid region 320 side.

The shapes of the microlens groups 414*a* and 414*b* are controlled by driving the driving unit 490 in an arrow direction to control the internal pressure of the liquid region 310. Here, a pressure when a flat-shaped interface is formed between both ends of the through hole on a liquid region 320 side is referred to as a reference pressure, the pressure of the first liquid with which the liquid region 310 is filled is maintained at the reference pressure or higher. When the pressure of the first liquid is increased to become larger than the reference pressure, an interface as indicated by a broken line 382 is formed. That is, with the position of the interface being supported at both ends of the through hole on the liquid region 320 side, an arch-shaped interface having an apex on an object side near the center of the through hole is formed.

When the pressure is further increased, an interface indicated by a broken line 381 is formed. That is, with the position of the interface being supported at both ends of the through hole on the liquid region 320 side, an arch-shaped interface with a smaller radius of curvature having an apex on an object side of the through hole is formed.

By controlling the shape of the interface in this manner, the shapes (focal lengths) of the microlens groups 414a and 414b with different focal lengths can be controlled.

As another embodiment of the imaging device 10, examples include portable telephones, smartphones, PDAs (Personal Digital Assistants), and portable game machines with a camera function. In the following, a smartphone is taken as an example, and description is made in detail with reference to the drawings.

<Structure of Smartphone>

Figure 17:
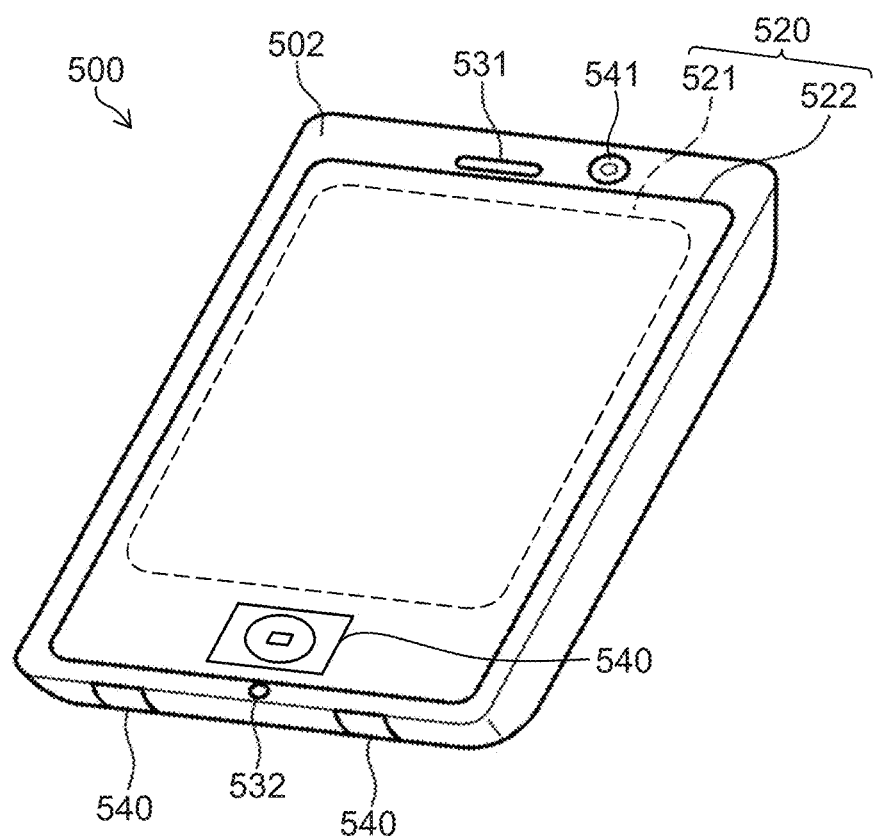
FIG. 17 is an external view of a smartphone, which is another embodiment of the imaging device.

FIG. 17 depicts an external view of a smartphone 500, which is another embodiment of the imaging device 10. The smartphone 500 depicted in FIG. 17 has a casing 502 in a flat plate shape, and includes a display input unit 520 on one surface of the casing 502, the display input unit 520 having a display panel 521 as a display unit and an operation panel 522 as an input unit integrated together. Also, the casing 502 includes a loudspeaker 531, a microphone 532, an operating unit 540, and a camera unit 541. Note that the structure of the casing 502 is not restricted to this and, for example, a structure in which the display unit and the input unit are independent from each other can be adopted, or a structure with a folding structure or a sliding mechanism can be adopted.

Figure 18:
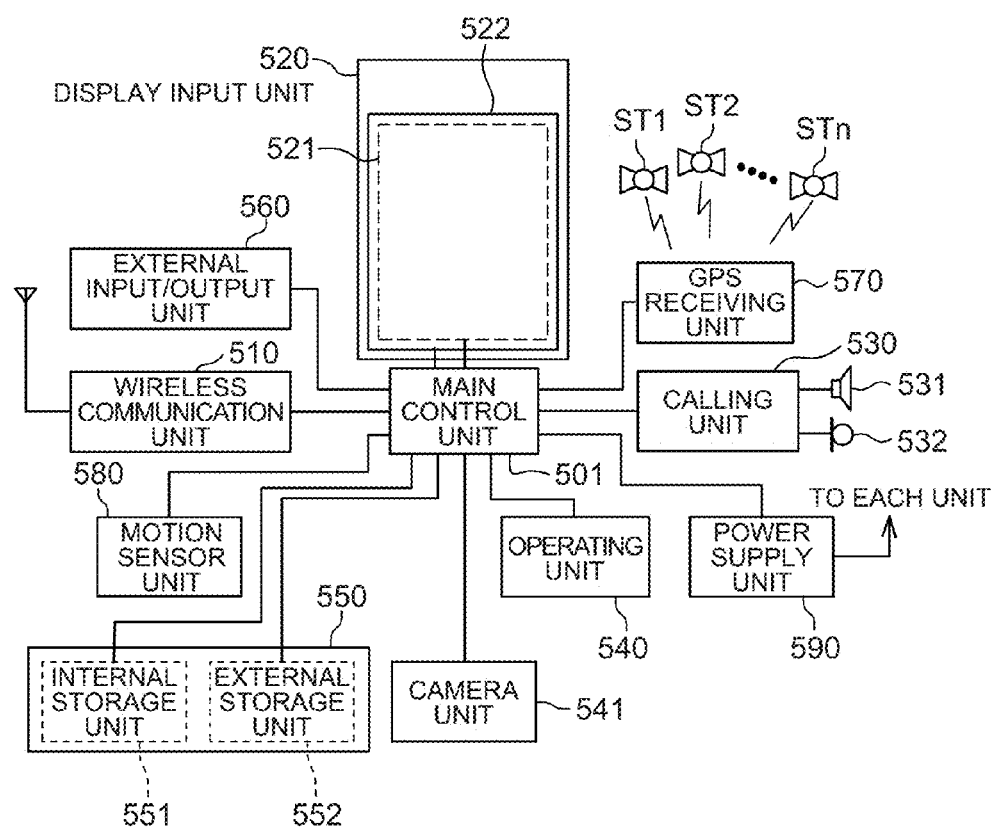
FIG. 18 is a block diagram depicting the structure of main parts of the smartphone.

FIG. 18 is a block diagram depicting the structure of the smartphone 500 depicted in FIG. 17. As depicted in FIG. 18, as main components of the smartphone, the smartphone includes a wireless communication unit 510, a display input unit 520, a calling unit 530, an operating unit 540, a camera unit 541, a storage unit 550, an external input/output unit 560, a GPS (Global Positioning System) receiving unit 570, a motion sensor unit 580, a power supply unit 590, and a main control unit 501. Also, as a main function of the smartphone 500, the smartphone includes a wireless communication function for performing mobile wireless communication via a base station device BS and a mobile communication network NW.

The wireless communication unit 510 follows an instruction from the main control unit 501 to perform wireless communication with the base station device BS accommodated in the mobile communication network NW. By using this wireless communication, various file data such as voice data and image data and electronic mail data are transmitted and received, and Web data, streaming data, and the like are received.

The display input unit 520 is a so-called touch panel which displays images (still pictures and moving pictures), character information, and the like under the control of the main control unit 501 to visually transmit information to a user and also detects a user operation with respect to the displayed information, and includes a display panel 521 and an operation panel 522. When generated 3D images are viewed, the display panel 521 is preferably a 3D display panel.

The display panel 521 uses an LCD (Liquid Crystal Display), OELD (Organic Electro-Luminescence Display), or the like as a display device.

The operation panel 522 is a device which is mounted so as to allow viewing of an image displayed on a display screen of the display panel 521 and detects one or plurality of coordinates operated by a finger of the user or a stylus. When this device is operated by a finger of the user or a stylus, a detection signal generated from the operation is outputted to the main control unit 501. Next, based on the received detection signal, the main control unit 501 detects an operation position (coordinates) on the display panel 521.

As depicted in FIG. 17, the display panel 521 of the smartphone 500 and the operation panel 522 integrally configure the display input unit 520 in an arrangement in which the operation panel 522 completely covers the display panel 521. When this arrangement is adopted, the operation panel 522 may include a function of detecting a user operation even for a region outside the display panel 521. In other words, the operation panel 522 may include a detection region for an overlapping portion overlapping the display panel 521 (hereinafter referred to as a display region) and the other detection region for an outer edge portion not overlapping the display panel 521 (hereinafter referred to as a non-display region).

Note that the size of the display region and the size of the display panel 521 may completely match each other, but it is not necessarily required for both to match each other. Also, the operation panel 522 may include two sensitive regions, that is, an outer edge portion and the other inner portion. Furthermore, the outer edge portion has a width that is designed as appropriate according to the size of the casing 502 or the like. Still further, examples of a position detection scheme adopted in the operation panel 522 include a matrix switch scheme, a resistive film scheme, a surface acoustic wave scheme, an infrared scheme, an electromagnetic induction scheme, a capacitance scheme, and the like, and any of these schemes can be adopted.

The calling unit 530 includes a loudspeaker 531 and a microphone 532. A user's voice inputted through the microphone 532 is converted to processable voice data by the main control unit 501 for output to the main control unit 501, and voice data received by the wireless communication unit 510 or the external input/output unit 560 is decoded and outputted from the loudspeaker 531. Also, as depicted in FIG. 17, for example, the loudspeaker 531 can be mounted on the same surface where the display input unit 520 is provided, and the microphone 532 can be mounted on a side surface of the casing 502.

The operating unit 540 is a hardware key using a key switch or the like, accepting an instruction from the user. For example, the operating unit 540 is a press-button-type switch mounted on a lower part or a lower side surface of the display unit of the casing 502 of the smartphone 500, the switch being turned ON when pressed with a finger or the like and turned to an OFF state by resiliency of a spring or the like when the finger is detached.

The storage unit 550 stores control program and control data of the main control unit 501, address data associated with the name, telephone number, and others of a communication counterpart, transmitted and received electronic mail data, Web data downloaded by Web browsing, and downloaded content data, and temporarily stores streaming data and the like. Also, the storage unit 550 is configured of an internal storage unit 551 incorporated in the smartphone and an external storage unit 552 having a removable external memory slot. Note that the internal storage unit 551 and the external storage unit 552 configuring the storage unit 550 are implemented by using a storage medium such as a flash memory type, a hard disk type, a multimedia card micro type, a card type memory (for example, Micro SD (registered trademark) memory, etc.), RAM (Random Access Memory), or ROM (Read Only Memory).

The external input/output unit 560 acts as an interface with all external devices coupled to the smartphone 500, and is to directly or indirectly connect to another external device by communication (for example, universal serial bus (USB), IEEE 1394, etc.) or a network (for example, the Internet, wireless LAN, Bluetooth (registered trademark), RFID (Radio Frequency Identification), infrared communication (Infrared Data Association: IrDA) (registered trademark), UWB (Ultra Wideband) (registered trademark), ZigBee (registered trademark), etc).

Examples of the external device coupled to the smartphone 500 include a wired/wireless headset, wired/wireless external recharger, a wired/wireless data port, a memory card or SIM (Subscriber Identity Module Card)/UIM card (User Identity Module Card) connected via a card socket, an external audio/video device connected via an audio/video I/O (Input/Output) terminal, a wirelessly connected external audio/video device, a smartphone for wired/wireless connection, a personal computer for wired/wireless connection, a PDA for wired/wireless connection, a personal computer for wired/wireless connection, and an earphone. The external input/output unit can transmit data transferred from any of these external devices to each component inside the smartphone 500 and also can cause data inside the smartphone 500 to be transferred to an external device.

The GPS receiving unit 570 receives GPS signals transmitted from GPS satellites ST1 to STn by following an instruction from the main control unit 501, performs a positioning computation process based on the plurality of received GPS signals, and detects the position of the smartphone 500 formed of the latitude, longitude, altitude, etc. When positional information is obtainable from the wireless communication unit 510 and the external input/output unit 560 (for example, wireless LAN), the GPS receiving unit 570 can also detect the position by using that positional information.

The motion sensor unit 580 includes, for example, a triaxial acceleration sensor, detecting physical movements of the smartphone 500 by following an instruction from the main control unit 501. By detecting physical movements of the smartphone 500, the moving direction and acceleration of the smartphone 500 are detected. This detection result is outputted to the main control unit 501.

The power supply unit 590 supplies electric power accumulated in a battery (not depicted) to each unit of the smartphone 500, by following an instruction from the main control unit 501.

The main control unit 501 includes a microprocessor, operates by following the control program and control data stored in the storage unit 550, and controls each unit of the smartphone 500 in a centralized manner. Also, for voice communication and data communication through the wireless communication unit 510, the main control unit 501 includes a mobile communication control function for controlling each unit of a communication system and an application processing function.

The application processing function is achieved by the main control unit 501 operating by following application software stored in the storage unit 550. Examples of the application processing function include an infrared communication function of controlling the external input/output unit 560 to perform data communication with a counterpart device, an electronic mail function for transmitting and receiving electronic mails, and a Web browsing function for viewing Web pages.

Also, the main control unit 501 includes an image processing function of displaying video on the display input unit 520 based on image data (data of still pictures and moving pictures) such as received data and downloaded streaming data. The image processing function is a function of the main control unit 501 decoding the image data and performing image processing on this decoding result to display an image on the display input unit 520.

Furthermore, the main control unit 501 performs display control over the display panel 521 and operation detection control for detecting a user operation through the operation unit 540 and the operation panel 522.

By performing display control, the main control unit 501 causes an icon for starting application software and a software key such as a scroll bar to be displayed or causes a window for composing an electronic mail to be displayed. Note that the scroll bar is a software key for accepting an instruction for moving a displayed portion of, for example, a large image that does not fit in a display region of the display panel 521.

Also, by performing operation detection control, the main control unit 501 detects a user operation through the operating unit 540, accepts an operation on the icon and an input of a character string in an input column of the window, or accepts a request for scrolling a display image through the scroll bar.

Furthermore, the main control unit 501 includes a touch panel control function of determining, by performing operation detection control, whether an operation position on the operation panel 522 is present in the overlapping portion overlapping the display panel 521 (display region) or the other outer edge portion not overlapping the display panel 521 (non-display region) to control the sensitive region of the operation panel 522 and the display position of the software key.

Still further, the main control unit 501 can also detect a gesture operation on the operation panel 522 and perform a preset function according to the detected gesture operation. The gesture operation refers to not a conventional simple touch operation but an operation of drawing a trail by a finger or the like, specifying a plurality of positions simultaneously or, by combining these, drawing a trail from at least one of the plurality of positions.

The camera unit 541 is a digital camera for electronic imaging by using an image pickup element such as a CMOS (Complementary Metal Oxide Semiconductor) or CCD (Charge-Coupled Device). To this camera unit 541, the above-described imaging device 10 can be applied. Since images at a plurality of focal distances obtained by combining the multifocal main lens and the multifocal microlens array can be simultaneously taken, a mechanical automatic focus adjusting function is not required, and this camera unit is suitable as a camera unit to be incorporated in a thin portable terminal as the smartphone 500.

Also, under the control of the main control unit 501, the camera unit 541 can convert image data obtained by imaging to compressed image data, for example, JPEG (Joint Photographic coding Experts Group), record the image data in the storage unit 550, and output the image data through the external input/output unit 560 or the wireless communication unit 510. In the smartphone 500 depicted in FIG. 17, the camera unit 541 is mounted on the same surface where the display input unit 520 is mounted. The mount position of the camera unit 541 is not restricted to this, and the camera unit 541 may be mounted on the back surface of the display input unit 520, or a plurality of camera unit 541 may be mounted. Note that when a plurality of camera unit 541 are mounted, the camera unit 541 for imaging can be switched for single imaging or the plurality of camera units 541 can be simultaneously used for imaging.

Furthermore, the camera unit 541 can be used for various functions of the smartphone 500. For example, an image obtained by the camera unit 541 can be displayed on the display panel 521, and the image of the camera unit 541 can be used as an operation input of the operation panel 522. Also, when detecting a position, the GPS receiving unit 570 can refer to an image from the camera unit 541 to detect the position. Furthermore, with reference to an image from the camera unit 541, the optical axis direction of the camera unit 541 of the smartphone 500 and also the current use environment can be determined without using a triaxial acceleration sensor or by using a triaxial acceleration sensor together. As a matter of course, an image from the camera unit 541 can be used within application software.

[Others]

The number of focal points of the multifocal main lens and the number of focal points of the multifocal microlens array are not restricted to those in the present embodiments, and various combinations can be thought. When the number of focal points of the multifocal main lens is taken as m and the number of focal points of the multifocal microlens array is taken as n, m and n may be any as long as each number is an integer of 2 or more. Also, the number of images at different focal distances that are simultaneously obtainable by the present invention is four or more.

According to the present invention, while a plurality of images at different focal distances can be obtained simultaneously, the user may check the focused state of each image before the image is recorded, and only the image specified by the user may be recorded. Also, regions where a plurality of images at different focal distances are focused can be combined together, and an image focused at all distances from a far distance to a near distance can be generated and recorded.

Also, an optical element for providing pupil directivity is not restricted to the microlens array configuring a plenoptic camera of the present embodiment (multifocal microlens array 14), the microprism array 110 provided on a front surface side of a microlens array for each light-receiving cell of the image sensor (multifocal microlens array 114), and a combination of the microlens array for each light-receiving cell of the image sensor (multifocal microlens array 114) and the light-shielding member 120. For example, a pupil dividing device such as one using a pupil dividing polarizing element (Japanese Patent Application Laid-Open No. 2009-162847) can be applied.

In the present embodiments, while an example using a CMOS-type image pickup element as an image sensor has been described, the image pickup element is not restricted to a CMOS-type, and another image sensor such as a CCD can also be applied.

Furthermore, the present invention is not restricted to the embodiments described above, and it goes without saying that the present invention can be variously modified within a range not deviating from the spirit of the present invention.

What is claimed is:

1. An imaging device comprising:
a multifocal main lens having m focal points, where m is an integer larger than 1, the multifocal main lens being a double-convex single lens comprising a first region with a first convexity defining a first focal distance for first-distance imaging and a second region with a second convexity, different from the first convexity, defining a second focal distance for second-distance imaging, the second distance being farther than the first distance, the first region and the second region being separated from each other by a light shielding band arranged to prevent crosstalk between light beams passing through the first and second regions;
an image sensor having a plurality of pixels configured of two-dimensionally arranged photoelectric converting elements;
a multifocal microlens array including a plurality of microlens groups having different focal distances disposed on an incident plane side of the image sensor, the multifocal microlens array having n focal points, where n is an integer larger than 1; and
an image obtaining device which obtains from the image sensor, m×n images respectively at a plurality of focal distances obtained by combining the multifocal main lens and the multifocal microlens array.

2. The imaging device according to claim 1, wherein in each of the pixels of the image sensors, an image is formed corresponding to any one in a range of the plurality of focal distances obtained by combining the multifocal main lens and the multifocal microlens array.

3. The imaging device according to claim 1, wherein the first and second focal distances of the multifocal main lens and the plurality of focal distances of the multifocal microlens array are determined so that the focal distances of the m×n images are spaced uniformly.

4. The imaging device according to claim 1, wherein the first and second focal distances of the multifocal main lens and the plurality of focal distances of the multifocal microlens array are determined so that the focal distances of the m×n images are spaced densely near one or more preset focal distances.

5. The imaging device according to claim 1, wherein in the multifocal microlens array, each of the microlens groups has an equal number of lenses.

6. The imaging device according to claim 1, wherein in the multifocal microlens array, each of the microlens groups has a different number of lenses.

7. The imaging device according to claim 1, wherein in the multifocal microlens array, each of the microlens groups has a different density according to a position in the multifocal microlens array.

8. The imaging device according to claim 1, further comprising a first focal distance changing device which changes at least one of the first and second focal distances of the multifocal main lens.

9. The imaging device according to claim 1, further comprising a second focal distance changing device which changes at least one of the focal distances of the plurality of microlens groups in the multifocal microlens array.

10. The imaging device according to claim 1, wherein the light shielding band is coincident with an optical axis of the multifocal main lens.

11. The imaging device according to claim 1, wherein the light shielding band is an annular ring.

* * * * *